United States Patent
Ho

(10) Patent No.: US 9,867,273 B2
(45) Date of Patent: Jan. 9, 2018

(54) PRINTED CIRCUIT, THIN FILM TRANSISTOR AND MANUFACTURING METHOD THEREOF

(71) Applicant: Winbond Electronics Corp., Taichung (TW)

(72) Inventor: Yu-Hsuan Ho, Taichung (TW)

(73) Assignee: Winbond Electronics Corp., Taichung (TW)

( * ) Notice: Subject to any disclaimer, the term of this patent is extended or adjusted under 35 U.S.C. 154(b) by 4 days.

(21) Appl. No.: 15/253,841

(22) Filed: Aug. 31, 2016

(65) Prior Publication Data

US 2017/0295639 A1    Oct. 12, 2017

(30) Foreign Application Priority Data

Apr. 11, 2016 (CN) .......... 2016 1 0220055

(51) Int. Cl.
| | |
|---|---|
| *H01L 21/00* | (2006.01) |
| *H05K 1/02* | (2006.01) |
| *H05K 1/09* | (2006.01) |
| *H05K 1/03* | (2006.01) |
| *H05K 3/12* | (2006.01) |
| *H05K 3/22* | (2006.01) |
| *H01L 29/786* | (2006.01) |

(Continued)

(52) U.S. Cl.
CPC ..... *H05K 1/0201* (2013.01); *H01L 21/02175* (2013.01); *H01L 21/02186* (2013.01); *H01L 21/02288* (2013.01); *H01L 21/288* (2013.01); *H01L 29/45* (2013.01); *H01L 29/66742* (2013.01); *H01L 29/78618* (2013.01); *H05K 1/0306* (2013.01); *H05K 1/09* (2013.01); *H05K 3/12* (2013.01); *H05K 3/22* (2013.01); *H05K 2201/026* (2013.01); *H05K 2201/0257* (2013.01); *H05K 2203/0783* (2013.01)

(58) Field of Classification Search
CPC .......... H05K 1/02; H05K 3/12; H05K 1/0306; H05K 3/22; H05K 1/09; H05K 2201/0257; H05K 2203/0783; H01L 29/78618; H01L 21/02288; H01L 21/02175; H01L 21/288; H01L 29/45; H01L 21/02186; H01L 29/66742
USPC ........................................................ 438/151
See application file for complete search history.

(56) References Cited

U.S. PATENT DOCUMENTS

| | | | |
|---|---|---|---|
| 8,760,606 B2* | 6/2014 | Allemand .............. | B82Y 10/00 349/111 |
| 2015/0287871 A1* | 10/2015 | Manders ............... | H01L 31/032 257/43 |

FOREIGN PATENT DOCUMENTS

| | | |
|---|---|---|
| TW | 200845155 | 11/2008 |
| TW | I375280 | 10/2012 |

(Continued)

OTHER PUBLICATIONS

"Office Action of Taiwan Counterpart Application," dated May 12, 2017, p1-p11.

*Primary Examiner* — Vu A Vu
(74) *Attorney, Agent, or Firm* — Jianq Chyun IP Office

(57) ABSTRACT

A printed circuit, a thin film transistor and manufacturing methods thereof are provided. The printed circuit includes a plurality of metal nanostructures and a metal oxide layer. The metal oxide layer is disposed on a surface of the metal nanostructures and fills a space at an intersection of the metal nanostructures. The metal oxide layer disposed on the surface of the metal nanostructures has a thickness of 0.1 nm to 10 nm.

6 Claims, 7 Drawing Sheets

(51) Int. Cl.
*H01L 29/45* (2006.01)
*H01L 21/288* (2006.01)
*H01L 29/66* (2006.01)
*H01L 21/02* (2006.01)

(56) References Cited

FOREIGN PATENT DOCUMENTS

TW          201610006       3/2016
WO          2015198857      12/2015

* cited by examiner

PRINTED CIRCUIT, THIN FILM TRANSISTOR AND MANUFACTURING METHOD THEREOF

CROSS-REFERENCE TO RELATED APPLICATION

This application claims the priority benefit of China application serial no. 201610220055.2, filed on Apr. 11, 2016. The entirety of the above-mentioned patent application is hereby incorporated by reference herein and made a part of this specification.

BACKGROUND OF THE INVENTION

Field of the Invention

The invention relates to a printed circuit, a thin film transistor and manufacturing methods thereof, and particularly relates to a printed circuit having excellent heat resistance and conductivity, a thin film transistor having an improved operating voltage and manufacturing methods thereof.

Description of Related Art

In a manufacturing process of a printed circuit today, the used conductive ink is mostly formed from mixing nano-structured metal particles and a solvent. However, since the oxidation rate of metal structures formed from the metal particles after nanostructured is significantly increased, the stability is reduced and the retention period is shortened. The current conductive ink is mostly formed from gold and/or silver nanoparticles or nanowires having high stability, but even so, when the conductive ink is exposed in air, the issues of reduction of stability and shortening of retention period are still generated. To solve the above issues, the current solution is mostly focused on the development of chemical synthesis methods, for example, forming a protective layer or a protective film on the metal nanoparticles. However, such method can only correspond to the specific metal. Therefore, the development of the manufacturing method of universal protective layers is the goal that needs to be made currently.

SUMMARY OF THE INVENTION

The invention provides a printed circuit having a metal oxide layer on metal nanostructures, and the metal oxide layer fills a space at an intersection of the metal nanostructures.

The invention provides a manufacturing method of a printed circuit capable of manufacturing a printed circuit having high stability and excellent conductivity.

The invention provides a thin film transistor having a metal oxide layer on metal nanostructures of a source and a drain thereof, and the metal oxide layer fills a space at an intersection of the metal nano structures.

The invention provides a manufacturing method of a thin film transistor capable of manufacturing a thin film transistor having an improved operating voltage.

The invention provides a printed circuit located on a substrate. The printed circuit includes a plurality of metal nanostructures and a metal oxide layer. The metal oxide layer is disposed on a surface of the metal nanostructures and fills a space at an intersection of the metal nanostructures, wherein the metal oxide layer located on the surface of the metal nanostructures has a thickness of 0.1 nm to 10 nm.

The invention provides a manufacturing method of a printed circuit including the following steps. First, a first printing process is performed to form a metal layer on a substrate, wherein the metal layer includes a plurality of metal nanostructures. Next, a second printing process is performed to form a metal oxide precursor layer on the metal layer, and the metal oxide precursor layer covers the metal layer, wherein the metal oxide precursor layer includes a metal oxide precursor and a solvent. Then, a heating process is performed to remove the solvent in the metal oxide precursor layer and reduce the metal oxide precursor in the metal oxide precursor layer to a metal oxide, so as to form a metal oxide layer on a surface of the metal nanostructures. Also, the metal oxide layer fills a space at an intersection of the metal nanostructures. The metal oxide layer formed on the surface of the metal nanostructure has a thickness of 0.1 nm to 10 nm.

The invention provides a thin film transistor including a source, a drain, an active layer, a dielectric layer, and a gate. The source and the drain are disposed on a substrate. The active layer covers the source and the drain and fills a space between the source and the drain. The dielectric layer covers the active layer. The gate is disposed on the dielectric layer. The source and the drain include a plurality of metal nanostructures and a metal oxide layer. The metal oxide layer is disposed on a surface of the metal nanostructures and fills a space at an intersection of the metal nanostructures, and the metal oxide layer disposed on the surface of the metal nanostructures has a thickness of 0.1 nm to 10 nm.

The invention provides a manufacturing method of a thin film transistor including the following steps. First, a first printing process is performed to form a patterned conductive layer on a substrate, wherein the patterned conductive layer includes a plurality of metal nanostructures. Next, a second printing process is performed to form a metal oxide precursor layer on the patterned conductive layer, and the metal oxide precursor layer covers the patterned conductive layer, wherein the metal oxide precursor layer includes a metal oxide precursor and a solvent. Then, a heating process is performed to remove the solvent in the metal oxide precursor layer and reduce the metal oxide precursor in the metal oxide precursor layer to a metal oxide, so as to form a metal oxide layer on a surface of the metal nanostructures. Also, the metal oxide layer fills a space at an intersection of the metal nanostructures. After that, an active layer is formed on the substrate to cover the patterned conductive layer and the metal oxide layer and fill a space between the patterned conductive layer. Thereafter, a dielectric layer is formed on the substrate to cover the active layer. Further, a gate is formed on the dielectric layer. The metal oxide layer formed on the surface of the metal nanostructures has a thickness of 0.1 nm to 10 nm.

Based on the above, since the printed circuit of the invention has the metal oxide layer on the surface of the metal nanostructures, it can prevent moisture from entering to avoid oxidation. Also, it can increase the heat resistance thereof and maintain the conductivity. Additionally, since the metal oxide layer will aggregate at the intersection between the metal nanostructures, it can help the bonding between the adjacent metal nanostructures, thereby enhancing the stability and the conductivity of the circuit. Additionally, since the thin film transistor of the invention has the metal oxide layer on the metal nanostructures in the source/drain, it can help the injection of electrons and holes, thereby changing the work function and improving the operating voltage of the thin film transistor.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
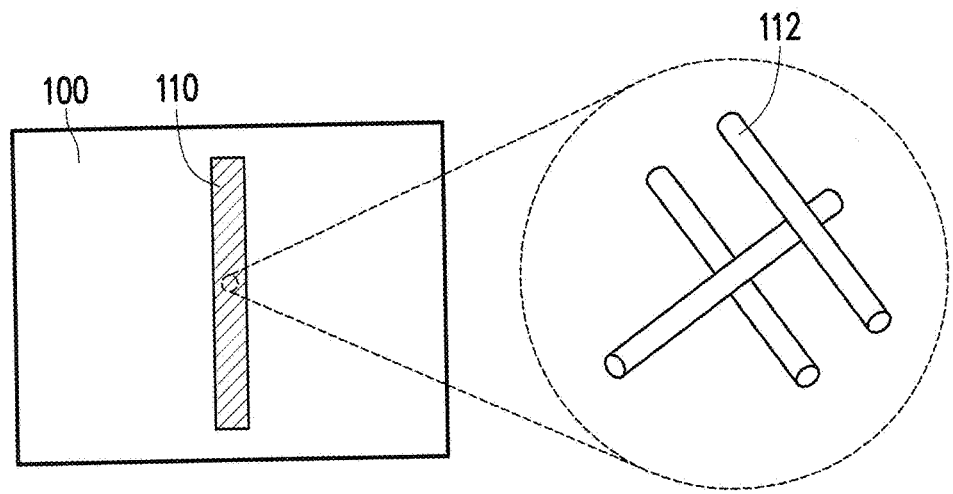
FIG. 1 to FIG. 3 are schematic diagrams illustrating a manufacturing process of a printed circuit of an embodiment of the invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
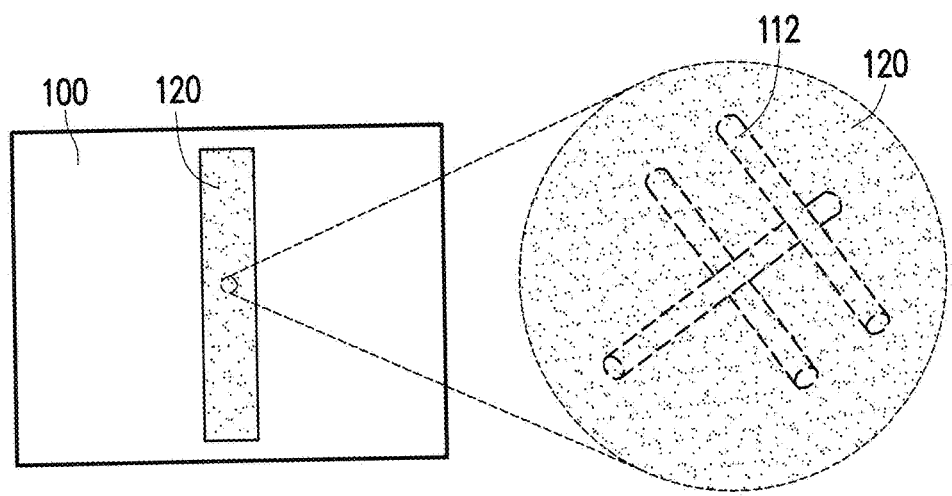
Figure 3:
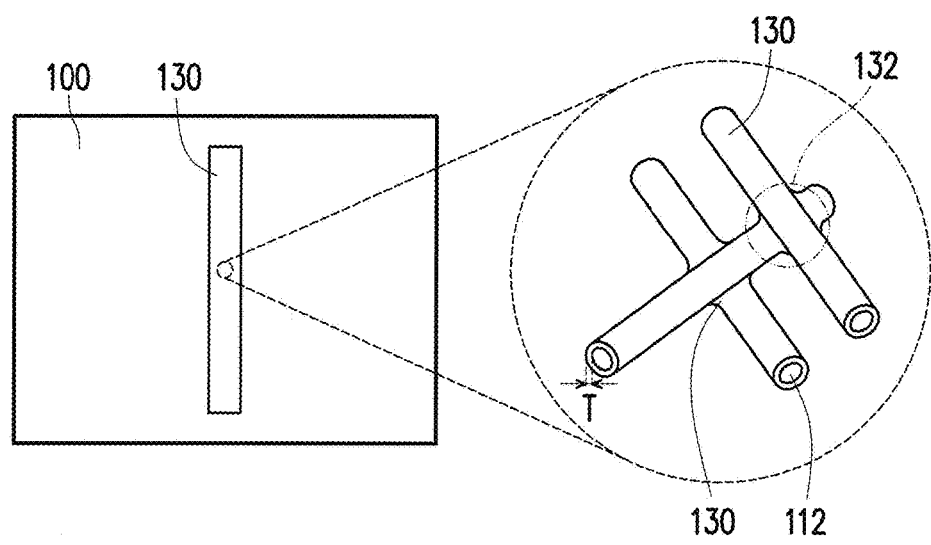

FIG. 1 to FIG. 3 are schematic diagrams illustrating a manufacturing process of a printed circuit of an embodiment of the invention.

First, referring to FIG. 1, a first printing process is performed to form a metal layer 110 on a substrate 100. The substrate 100 is a glass substrate or a silicon substrate, for example. A method of forming the metal layer 110 is an inkjet printing method, for example. In the embodiment, the metal layer 110 includes a plurality of metal nanostructures 112. The metal nanostructures 112 may be metal nanowires, nanoparticles, or a combination thereof. A material of the metal nanostructures 112 is gold, silver, or copper, for example. A line width of the metal nanowires is between 10 nm and 50 nm, for example. A particle size of the metal nanoparticles is between 10 nm and 300 nm, for example.

Next, referring to FIG. 2, a second printing process is performed to form a metal oxide precursor layer 120 on the metal layer 110, and the metal oxide precursor layer 120 covers the metal layer 110. A method of forming the metal oxide precursor layer 120 is that, for example, printing a metal oxide precursor solution in colloidal state onto the metal layer 110 using the inkjet printing method, so that the metal oxide precursor solution in colloidal state completely covers the metal layer 110. In the embodiment, the metal oxide precursor solution includes a metal oxide precursor and a solvent. A material of the metal oxide precursor is a titanium dioxide precursor, a zinc oxide precursor, or a tungsten oxide precursor, for example. The solvent is water, for example.

In the embodiment, the metal oxide precursor layer 120 is printed on the metal layer 110 after the metal layer 110 is printed on the substrate 100, rather than mixing the solution for forming the metal layer and the solution forming the metal oxide precursor layer 120 and then printing the above mixture onto the substrate 100. Thus, it is not necessary to test or adjust the optimum parameters for printing the above mixture. Thereby, in addition to simplify the manufacturing process, the issue of nozzle blocking caused by improper mixing can be reduced.

Then, referring to FIG. 3, a heating process is performed to heat the metal oxide precursor layer 120, so as to form a metal oxide layer 130 on a surface of the metal nanostructures 112. At this point, the fabrication of the printed circuit 10 is completed. In specific, in the process of heating, the solvent in the metal oxide precursor layer 120 is removed by heating, and the metal oxide precursor is reduced to a metal oxide. Additionally, in the process of solvent evaporation, the metal oxide layer 130 is not only formed on the surface of the metal nanostructures 112, but also gradually aggregates toward an intersection 132 of the metal nanostructures 112. That is to say, after the heating process, the metal oxide layer 130 will fill the space at the intersection 132 of the metal nanostructures 112. In the embodiment, the metal oxide layer 130 formed on the surface of the metal nanostructures 112 has a thickness T of 0.1 nm to 10 nm.

In the embodiment, a method of heating the metal oxide precursor layer 120 is that, for example, the substrate formed with the metal oxide precursor layer is placed in an oven to heat. However, the invention is not limited thereto. In another embodiment, the metal oxide precursor layer 120 can be heated by using a heating plate, irradiation, or hot air. The temperature of heating the metal oxide precursor layer 120 is between 50° C. and 200° C., for example. The time of heating the metal oxide precursor layer 120 is between 5 min and 120 min, for example.

In the embodiment, since the metal oxide layer 130 is formed on the surface of the metal nanostructures 112, the metal oxide layer 130 can be used as a protective film to prevent moisture and avoid oxidation. Additionally, the metal oxide layer 130 which aggregates at the intersection 132 of the metal nanostructures 112 may also help the bonding between the adjacent metal nanostructures 112, thereby enhancing the stability and the conductivity of the circuit. Additionally, the metal oxide layer 130 may also increase the adhesion between the circuit and the substrate, thereby enhancing the stability of the overall circuit structure.

FIG. 4A to FIG. 4D are schematic cross-sectional diagrams illustrating a manufacturing process of a thin film transistor 20 of an embodiment of the invention.

Figure 4A:
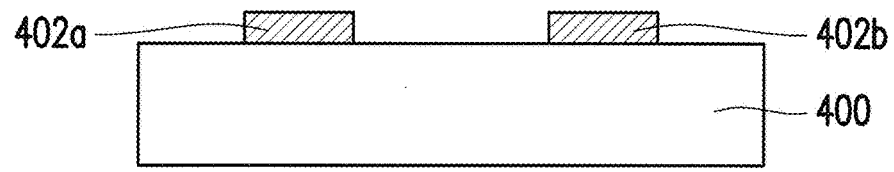
FIG. 4A to FIG. 4D are schematic cross-sectional diagrams illustrating a manufacturing process of a thin film transistor of an embodiment of the invention.

First, referring to FIG. 4A, a source 402a and a drain 402b are formed on a substrate 400. In the embodiment, the methods of forming the source 402a and the drain 402b are the same as FIG. 1 to FIG. 3. Particularly, first, the first printing process is performed to form a patterned conductive layer (not shown) on the substrate 400. Next, the second printing process and the heating process are performed on the patterned conductive layer to form the source 402a and the drain 402b on the substrate 400.

In the embodiment, since the surface of the metal nanostructures of the source 402a and the drain 402b has the metal oxide layer, the metal oxide layer can be used as a protective film to prevent moisture and avoid oxidation. Additionally, the metal oxide layer which aggregates at the intersection of the metal nanostructures may also help the bonding between the adjacent metal nanostructures, thereby enhancing the stability and the conductivity of the source 402a and the drain 402b.

Figure 4B:
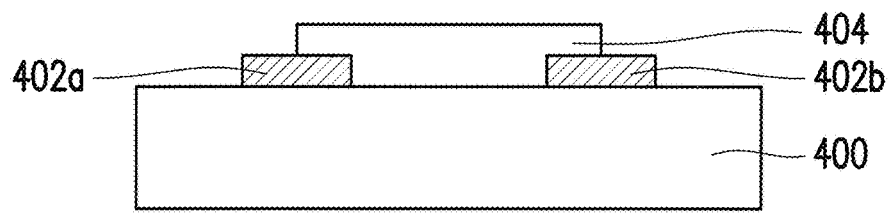

Then, referring to FIG. 4B, an active layer 404 is formed on the substrate 400. The active layer 404 covers the source 402a and the drain 402b and fills the space between the source 402a and the drain 402b. In the embodiment, the active layer 404 covers parts of upper surface of the source 402a and the drain 402b. In another embodiment, the active layer 404 may also completely cover the source 402a and the drain 402b. A material of the active layer 404 is an organic semiconductor or an inorganic semiconductor, for example. A method of forming the active layer 404 is an inkjet printing method, for example.

Figure 4C:
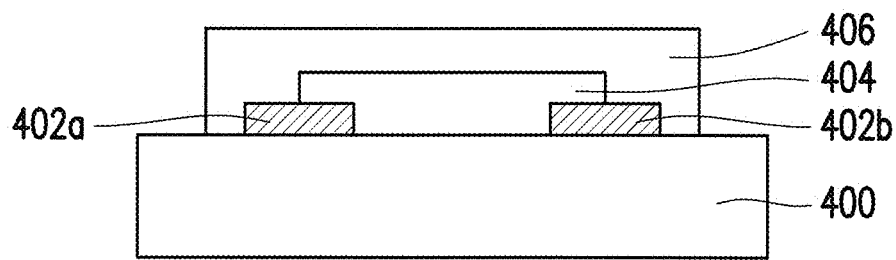

Then, referring to FIG. 4C, a dielectric layer 406 is formed on the substrate 400. The dielectric layer 406 covers the active layer 404. A material of the dielectric layer 406 is a dielectric material, such as silicon oxide or silicon nitride. A method of forming the dielectric layer 406 is an inkjet printing method, for example.

Figure 4D:
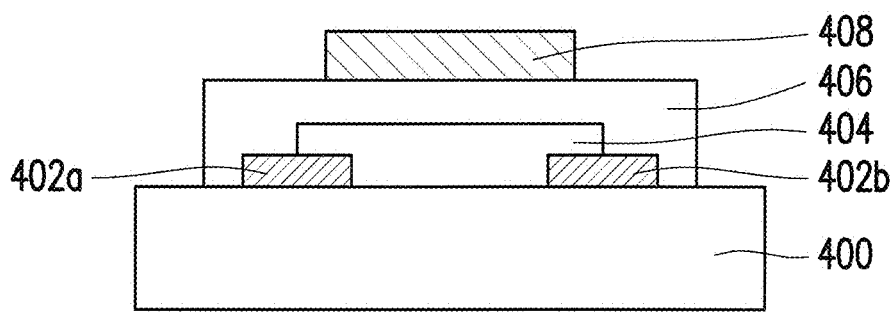

After that, referring to FIG. 4D, a gate 408 is formed on the dielectric layer 406. A material of the gate 408 is a conductive material, such as metal, doped polycrystalline silicon, or transparent conductive oxide. The metal is gold, silver, aluminum, copper, chromium, nickel, titanium, platinum, palladium, or an alloy of the above materials, for example. The transparent conductive oxide is indium tin oxide, for example. A method of forming the gate 408 is an inkjet printing method, for example. At this point, the fabrication of the thin film transistor 20 is completed.

In the embodiment, since the source and the drain have the metal oxide layer on the metal nanostructures, and the metal oxide layer fills the space at the intersection of the metal nanostructures, it helps the injection of electrons and holes, thereby changing the work function and improving the operating voltage of the thin film transistor.

Hereinafter, examples of the invention are listed to describe the invention more particularly. However, without departing from the spirit of the invention, the material and the using method which are described in the following examples can be suitably modified. Accordingly, restrictive interpretation should not be made to the invention based on the examples described below.

[Manufacturing of Printed Circuit Having Protective Film]

Example 1

First, a metal ink containing silver nanowires was printed on a substrate. Next, a colloid composition containing a $TiO_2$ precursor was printed on the metal ink, and then baked at 150° C. for 1 hour to remove a solvent, so that the $TiO_2$ precursor was reduced to $TiO_2$ on the surface of the silver nanowires. At this point, the printed circuit having the $TiO_2$ protective film was formed on the substrate.

Figure 5A:
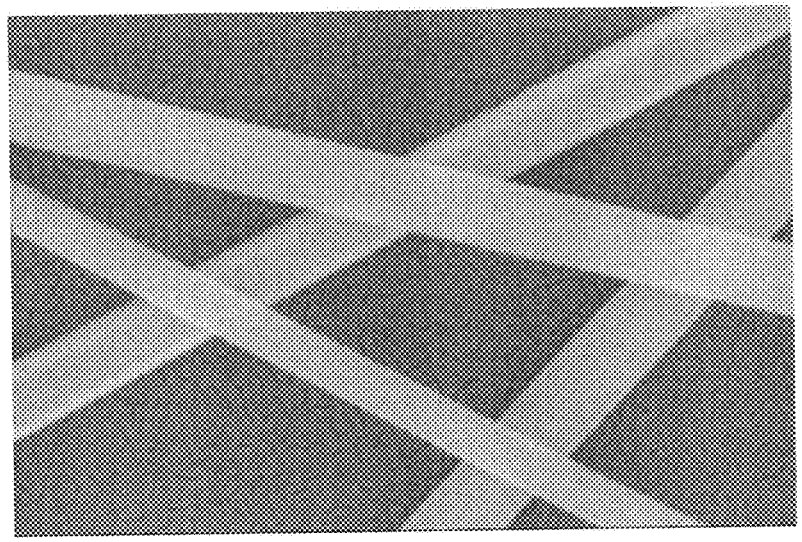
FIG. 5A is a scanning electron microscope (SEM) photograph of silver nanowires before printing a colloid composition.
Figure 5B:
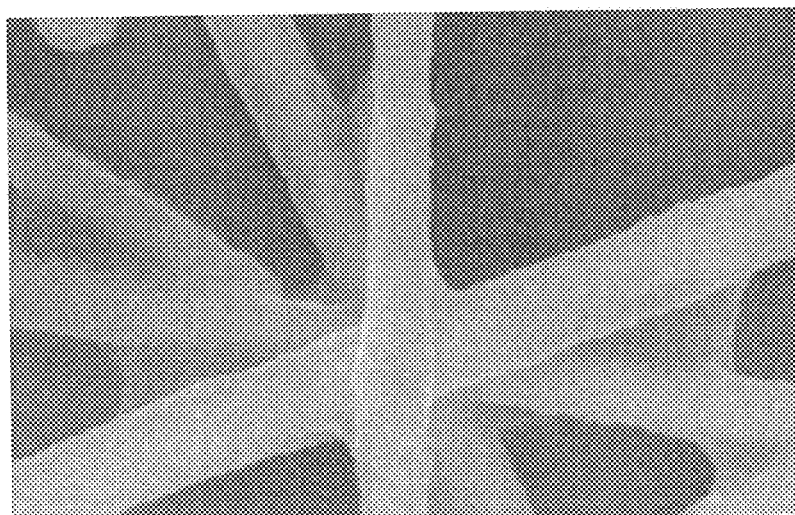
FIG. 5B is a scanning electron microscope photograph of silver nanowires after printing the colloid composition and baking.

FIG. 5A is an SEM photograph of silver nanowires before printing a colloid composition. FIG. 5B is an SEM photograph of silver nanowires after printing the colloid composition and baking. It can be learned from FIG. 5B that, after the printed colloid composition is baked, the collide is not only formed on the surface of the silver nanowires, but also aggregates at the intersection of the silver nanowires, which helps the bonding between the adjacent silver nanowires, thereby enhancing the stability and the conductivity of the circuit.

[Thermal Stability Test]

Example 2 (Printing Metal Ink and Colloid Composition Containing $TiO_2$ Precursor)

First, a metal ink containing silver nanowires was printed on a substrate. Next, a colloid composition containing a $TiO_2$ precursor was printed on the metal ink. Then, a heating process was performed to remove a solvent. Then, after baking at 400° C. for 1 hour, the state of the silver nanowires was observed using a scanning electron microscope.

Comparative Example 1 (Only Printing Metal Ink)

First, a metal ink containing silver nanowires was printed on a substrate. Next, a heating process was performed to remove a solvent. Then, after baking at 250° C. for 1 hour, the state of the silver nanowires was observed using a scanning electron microscope.

Figure 6A:
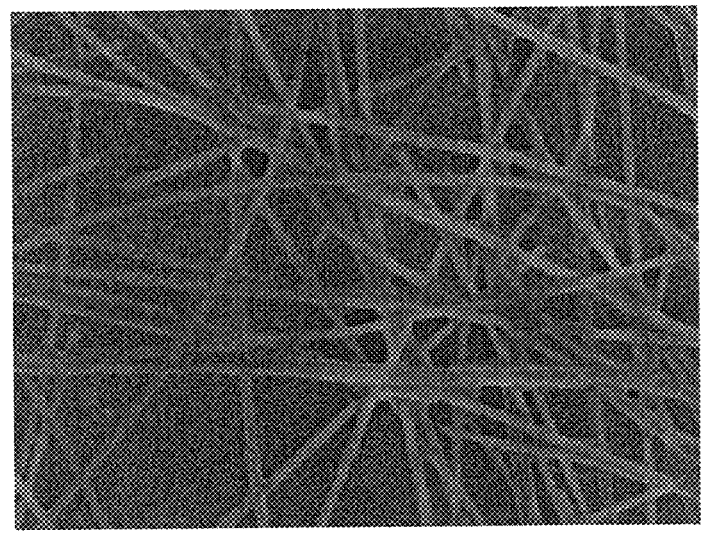
FIG. 6A is an SEM photograph of silver nanowires of Example 2.
Figure 6B:
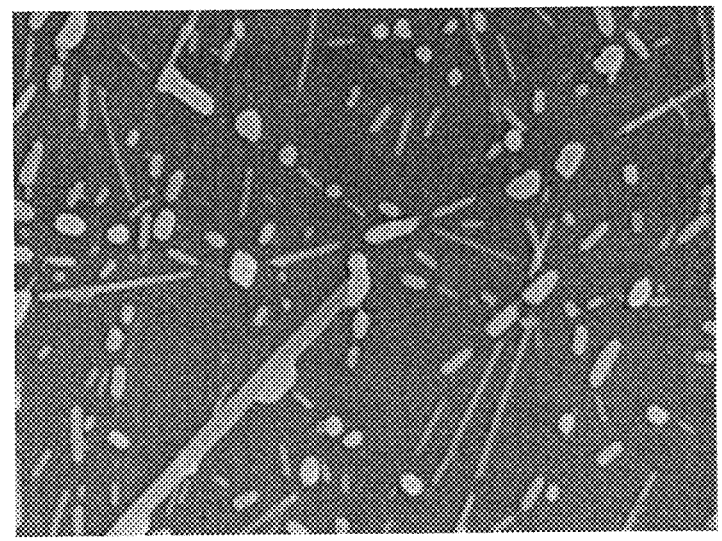
FIG. 6B is an SEM photograph of silver nanowires of Comparative example 1.

FIG. 6A is an SEM photograph of silver nanowires of Example 2. FIG. 6B is an SEM photograph of silver nanowires of Comparative example 1.

It can be learned from FIG. 6A that, the appearance of the silver nanowires of Example 1 still remains intact and transparent after baking at 400° C. for 1 hour. Compared to Comparative example 1, it can be learned from FIG. 6B that, the silver nanowires of Comparative example 1 is melted and aggregates into silver particles due to high temperature after baking at 250° C. for 1 hour. From the above results, since the silver nanowires of Example 1 are coated with the protective film in colloidal state, it can prevent moisture from entering and enhance the thermal stability.

[Effects of Different Temperature on Conductivity]

Since high temperature may affect the stability of the silver nanowires, and the stability of the silver nanowires may correspond to the conductivity of the silver nanowires, the conductivity of the silver nanowires formed at different baking temperature was further tested. In the embodiment, the baking manufacturing process under different temperature conditions was performed on the silver nanowires with the protective film and the silver nanowires without the protective film, and sheet resistance of the silver nanowires manufactured under each temperature condition was measured.

Example 3

First, a metal ink containing silver nanowires was printed on a substrate. Next, a colloid composition containing a $TiO_2$ precursor was printed on the metal ink. Then, a heating process was performed to remove a solvent. Then, after baking at 25° C., 50° C., 100° C., 150° C., 200° C., 250° C., 300° C., and 400° C. for 1 hour respectively, sheet resistance of the silver nanowires having the protective film at each temperature point was measured.

Comparative Example 2

First, a metal ink containing silver nanowires was printed on a substrate. Next, a heating process was performed to remove a solvent. Then, after baking at 25° C., 50° C., 100° C., 150° C., 200° C., 250° C., 300° C., and 400° C. for 1 hour respectively, sheet resistance of the silver nanowires having the protective film at each temperature point was measured.

Figure 7:
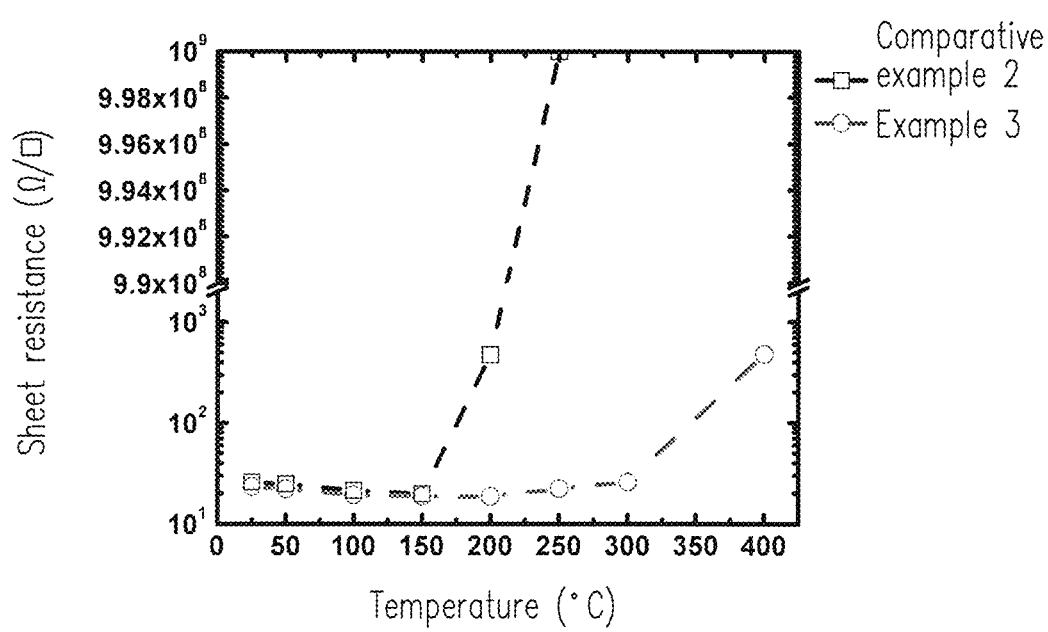
FIG. 7 is a curve diagram of the relationship between temperature and sheet resistance of Example 3 and Comparative example 2.

FIG. 7 is a curve diagram of the relationship between temperature and sheet resistance of Example 3 and Comparative example 2. It can be learned from FIG. 7 that, sheet resistance of the silver nanowires of Comparative example 2 is significantly increased after baking at 200° C. Compared to Example 3, since the silver nanowires of Example 3 have the protective film, low sheet resistance is still maintained even after baking at 300° C. In other words, since the silver nanowires of Example 3 are coated with the protective film in colloidal state, it can prevent moisture from entering. Also, it can effectively increase the heat resistance and maintain the conductivity of the silver nanowires.

In summary, since the circuit structure of the invention has the metal oxide protective film on the metal nanostructures thereof, it can prevent moisture from entering to avoid oxidation. Also, it can increase the heat resistance thereof and maintain the conductivity. Additionally, the metal oxide layer which aggregates at the intersection of the metal nanostructures may also help the bonding between the adjacent metal nanostructures, thereby enhancing the stability and the conductivity of the circuit structure. Additionally, since the source/drain of the thin film transistor of the invention has the metal oxide layer, it can help the injection of electrons and holes, thereby changing the work function and improving the operating voltage of the thin film transistor.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A manufacturing method of a thin film transistor, comprising:
   performing a first printing process to form a patterned conductive layer on a substrate, wherein the patterned conductive layer comprises a plurality of metal nanostructures;
   performing a second printing process to form a metal oxide precursor layer on the patterned conductive layer, the metal oxide precursor layer covering the patterned conductive layer, wherein the metal oxide precursor layer comprises a metal oxide precursor and a solvent; and
   performing a heating process to remove the solvent in the metal oxide precursor layer and transforming the metal oxide precursor in the metal oxide precursor layer to a metal oxide, so as to form a metal oxide layer on a surface of the metal nanostructures, the metal oxide layer aggregates in a space at an intersection of the metal nanostructures;
   forming an active layer on the substrate to cover the patterned conductive layer and the metal oxide layer and fill a space between the patterned conductive layer;
   forming a dielectric layer on the substrate to cover the active layer; and
   forming a gate on the dielectric layer,
   wherein the metal oxide layer formed on the surface of the metal nanostructures has a thickness of 0.1 nm to 10 nm.

2. The manufacturing method of the thin film transistor according to claim 1, wherein the metal nanostructures comprise metal nanowires, metal nanoparticles, or a combination thereof.

3. The manufacturing method of the thin film transistor according to claim 1, wherein a material of the metal nanostructures comprises gold, silver, or copper.

4. The manufacturing method of the thin film transistor according to claim 1, wherein a material of the metal oxide precursor comprises a titanium dioxide precursor, a zinc oxide precursor, or a tungsten oxide precursor.

5. The manufacturing method of the thin film transistor according to claim 1, wherein the solvent comprises water.

6. The manufacturing method of the thin film transistor according to claim 1, wherein a temperature for performing the heating process is between 50° C. and 200° C.

* * * * *